US007675149B1

(12) United States Patent
Strittmatter et al.

(10) Patent No.: US 7,675,149 B1
(45) Date of Patent: Mar. 9, 2010

(54) CHECK VALVE PACKAGE FOR PB-FREE, SINGLE PIECE ELECTRONIC MODULES

(75) Inventors: Patrick Clement Strittmatter, Frisco, TX (US); Joseph P. Hundt, Lake Kiowa, TX (US); Steven N. Hass, Dallas, TX (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 497 days.

(21) Appl. No.: 11/520,469

(22) Filed: Sep. 12, 2006

(51) Int. Cl.
*H01L 23/02* (2006.01)

(52) U.S. Cl. ................ 257/678; 257/704; 257/E23.001

(58) Field of Classification Search ................ 257/738, 257/678, 704, E23.001, 707
See application file for complete search history.

(56) References Cited

U.S. PATENT DOCUMENTS

2006/0081983 A1 * 4/2006 Humpston et al. .......... 257/738
2008/0162789 A1 * 7/2008 Choi et al. .................. 711/103

* cited by examiner

*Primary Examiner*—Davienne Monbleau
*Assistant Examiner*—Hoa B Trinh
(74) *Attorney, Agent, or Firm*—Blakely Sokoloff Taylor & Zafman LLP

(57) ABSTRACT

Check valve package for pb-free, single piece electronic modules, the package having an exterior and an interior, and at least one electronic device mounted within the interior of the package electrically connected to a lead-free solder ball grid array on a surface of the package, the package having a check valve between the interior and exterior of the package configured to allow flow from the interior to the exterior and to prevent flow form the exterior to the interior. The package withstands the solder reflow temperatures for the reflow of the pb-free solder balls of a ball grid array packaging of an NVSRAM during mounting on a circuit board. The package is suitable for packaging circuits containing rechargeable batteries and for packaging other electronic devices.

6 Claims, 3 Drawing Sheets

CHECK VALVE PACKAGE FOR PB-FREE, SINGLE PIECE ELECTRONIC MODULES

BACKGROUND OF THE INVENTION

1. Field of the Invention

The present invention relates to the field of electronic packaging.

2. Prior Art

Maxim Integrated Products, Inc., through its wholly owned subsidiary, Dallas Semiconductor, has introduced the SPM product family that is a manganese lithium battery backed NVSRAM (nonvolatile static RAM). The product is unique to the industry in that the battery used to backup the SRAM is reflowable, that is, will withstand the solder reflow temperatures required for mounting onto a circuit board. Therefore the battery can be onboard the module during customer reflow. This is opposed to current systems of competitors where the battery must be attached by hand after reflow, since until recently no battery existed that could take reflow temperatures (235 C). An enclosure around the battery is required because it cannot withstand a customer water wash in its bare form. This would expose the battery to mobile ionics and eventually short the battery. For a standard eutectic reflow profile where the package is not expected to exceed 235 C, this package is qualified.

235 C is the maximum temperature requirement for reflow of lead (Pb) containing solder. However for lead free solder, exposure to a reflow temperature of 260 C may be required. For the battery package in the SPM product family, a temperature of 260 C tends to diminish the integrity of the battery enclosure, providing the opportunity of moisture intrusion over time that may cause malfunction or premature failure of the battery backup.

DETAILED DESCRIPTION OF THE PREFERRED EMBODIMENTS

For a package to obtain a Pb-free designation, it must be able to withstand the temperatures prescribed in JEDEC STD-020 Rev C, where the maximum temperature required is 260 C. The current standard single piece module (SPM) uses a plastic cap or cover bonded with epoxy to the substrate. This protection creates a near airtight cavity inside the package. When this package undergoes IR reflow, the air inside the package is heated and thus expands at a predictable rate per the Ideal Gas Law. What is not predictable is the amount of moisture or condensation a given SPM may have inside. All packages will have some amount of liquid water due to capillary condensation inside the micro-voids of the package components. Even a tiny amount of liquid moisture can be fatal to a near air tight, non-hermetic package, since during reflow this moisture will expand to many times its original volume and may cause gross package cracks due to internal pressures. In the standard, non Pb-free version, the internal pressures have been overcome with a material set that has been proven to maintain package integrity through all reliability stress.

However the Pb-free SPM will need to be able to withstand a reflow temperature that is roughly 20 C higher than the current version. Through experimentation it was determined that the current material set cannot withstand this increased temperature, and produced unacceptable gross failure rates through package cracks.

Figure 1:
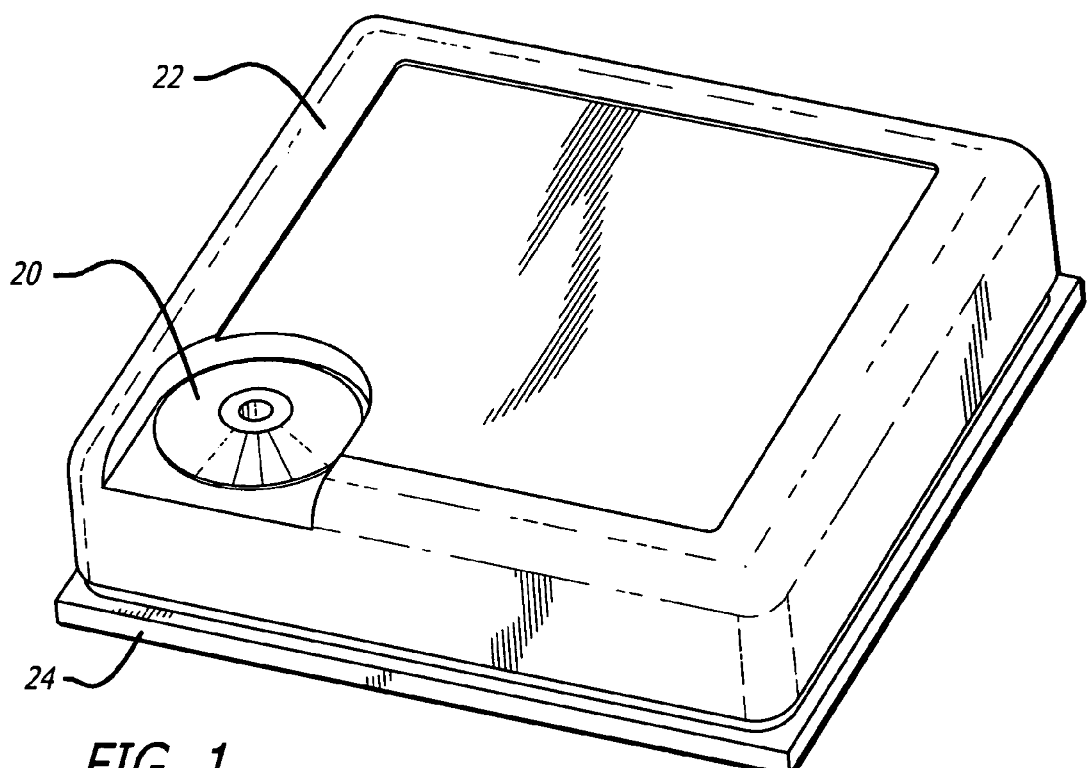
FIG. 1 is a perspective view of a package incorporating a preferred embodiment of the present invention.
Figure 2:
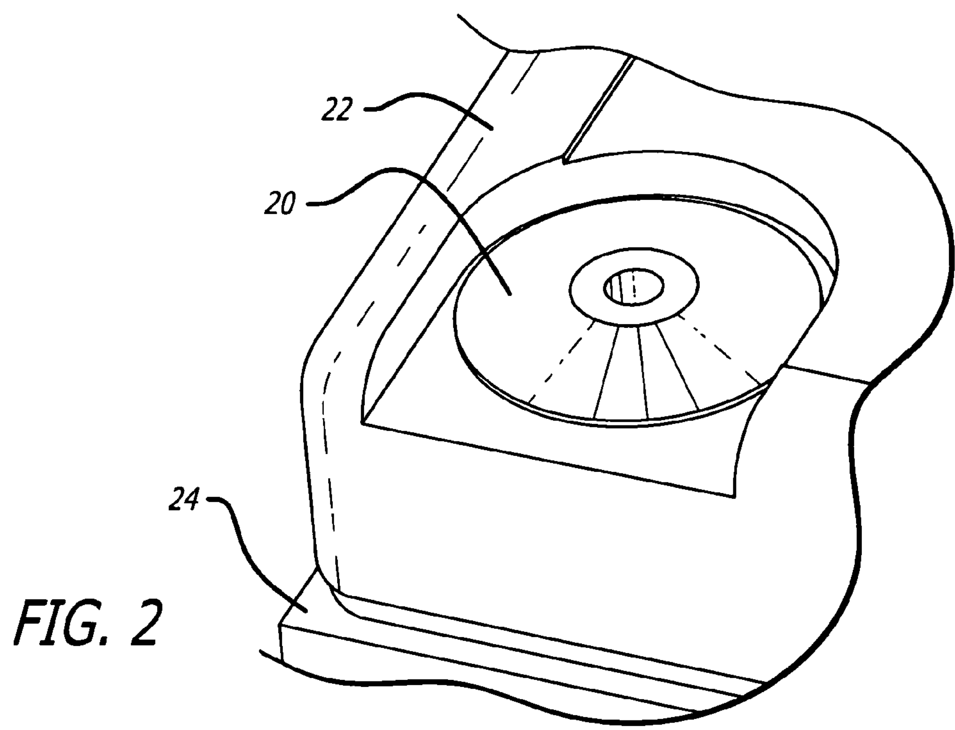
FIG. 2 is a view of part of the package of FIG. 1 taken on an expanded scale better showing the silicone rubber umbrella check valve.
Figure 3:
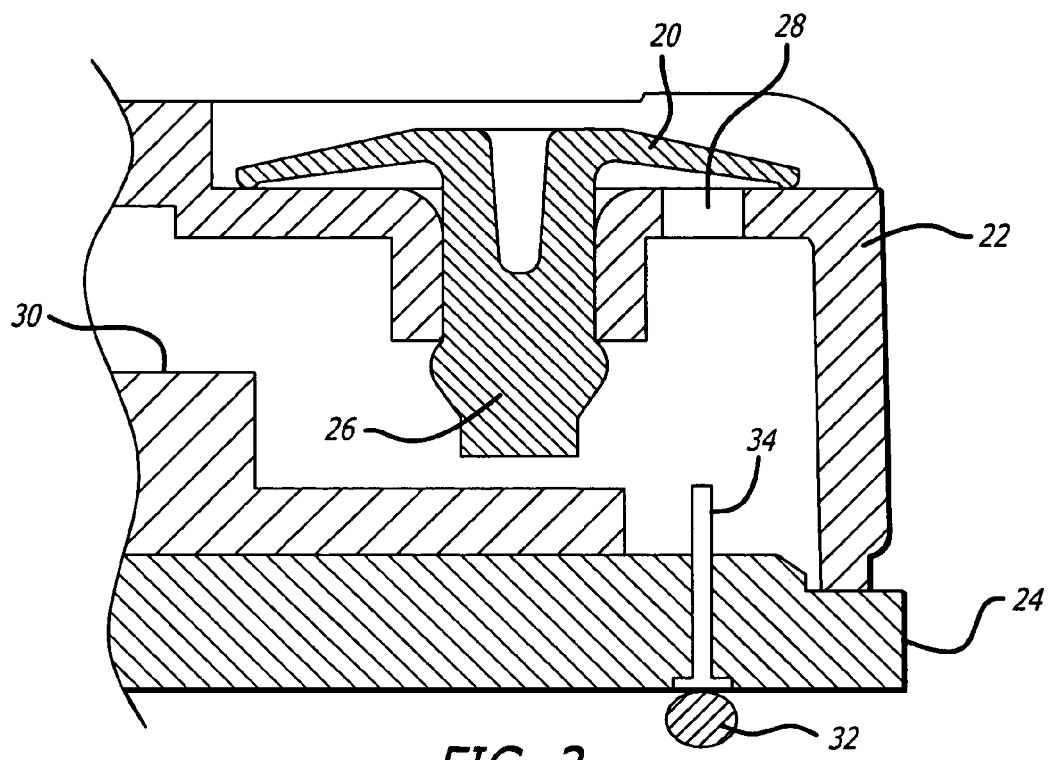
FIG. 3 is a cross section of a part of the package of FIGS. 1 and 2 taken through the silicone rubber umbrella check valve.

The crux of this invention is a packaging method and apparatus that will allow expanded air and steam to escape the package via a vent, at the same time not allowing any external air/moisture/contaminants back into the package. This is achieved using a silicone rubber umbrella check valve 20 inserted into the cover or cap 22 of the package as shown in FIGS. 1 and 2. The umbrella valve 20 itself may be a commercially available, off the shelf umbrella valve available from several different vendors. Such valves are usually used in medical and household appliances where pressure relief is necessary. The fact that these valves are made of silicone rubber is advantageous for the present application, since silicone rubber can withstand temperatures in excess of 260 C. The seat for the valve 20 may molded into the cap 22 as shown in FIG. 3 in such a way that the overall package height does not grow from the height of the prior product even though it now has a vent inserted into the top of it.

Figure 4:
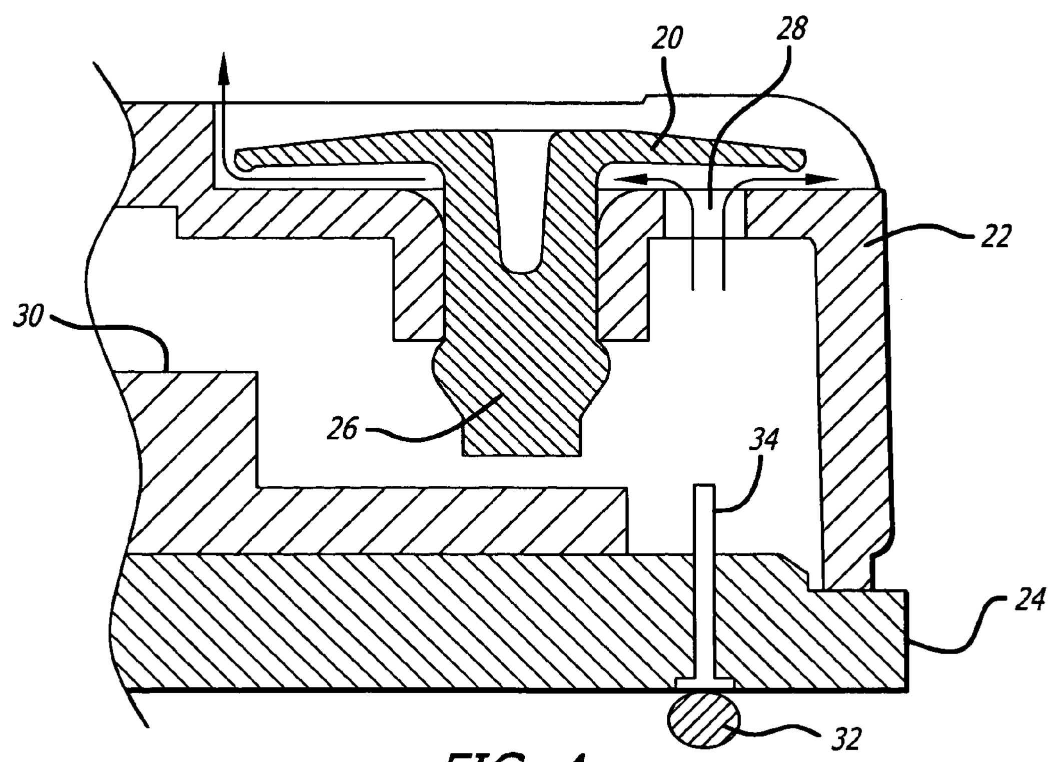
FIG. 4 is a cross section similar to that of FIG. 3, but showing the silicone rubber umbrella check valve allowing gas to escape from the package.
Figure 5:
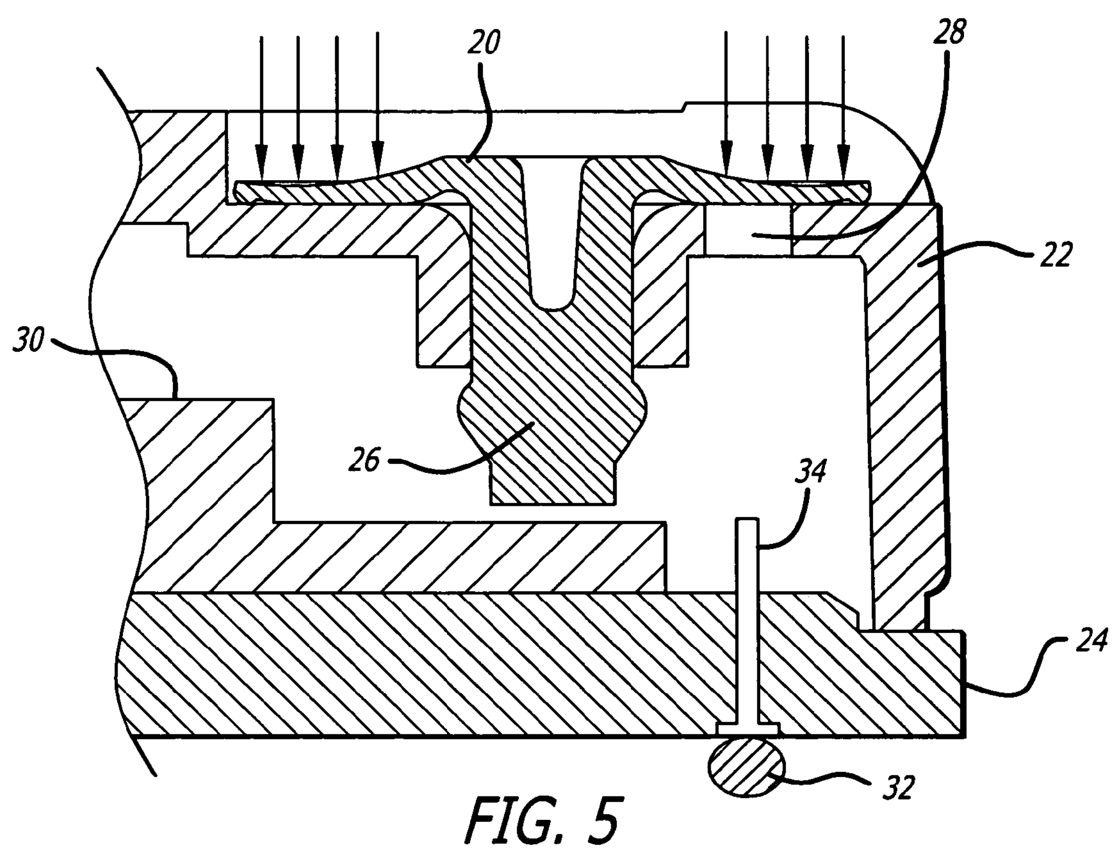
FIG. 5 is a cross section similar to that of FIG. 3, but showing the silicone rubber umbrella check valve sealing against an external pressure to prevent anything from entering the package.

The seat also allows for liquid moisture that has accumulated around the top of the valve during water wash to drain away. In particular, when the package is heated, the umbrella edges elastically lift under the influence of the increase in pressure internal to the package due both to the expansion of the gas in the package and the conversion of moisture in the package to steam as shown in FIG. 4, thereby relieving the increased pressure. As the package cools, the gas within the package contracts, which reverses the flow of gas through the vent hole and allows the umbrella periphery to seat and tightly seal the package for the subsequent water wash. Since the umbrella is deflected, even when resting on the seat, the umbrella will remain sealed against the cap 22 to prevent entry of moisture or contaminants.

In the preferred embodiment, in addition to the silicone rubber valve 20 and an injection molded cover or cap 22, the package further comprises a base 24, typically with lead free solder bump (ball grid array) electrical connections 32 on the bottom thereof and electrical through connections 34 for electrical connection to the components mounted to the base in the package, as is well known in the industry. In a preferred embodiment, the base is actually the printed circuit board containing electronic components, though could be other devices or materials, such as a substrate of a MEMS device, or simply be an injection molded base with one or more components mounted therein. Typically the cap 22 is fastened to the base and sealed (not hermetic) by epoxy, though other means of attachment may be used. The package in a preferred embodiment is for packaging devices 30 such as NVSRAM products having a built-in battery for battery backup that can qualify for Pb-free solder reflow temperature requirements. However clearly other devices 30 such as integrated circuits or multi-chip modules may be packaged for Pb-free solder reflow using the present invention, particularly when packaged with a rechargeable backup battery. Also other electronic devices 30 may be packaged using the present invention, such as, by way of example MEMS devices. The invention is readily scalable for different package sizes, and because the flow rate of gases out of the package during heating is not large, relatively small silicone rubber umbrella check valves relative to the package size may be used. In that regard, possibly other materials could be used for the check valve other than silicone rubber, though silicone rubber is preferred as being easy to work with, readily available and unaffected by the high temperature involved. Similarly other valve configurations could be used, preferably using silicone rubber, such as for a flapper valve or other configuration, but again, the silicone rubber umbrella check valve is preferred as being simple, already commercially available, reliable and easily assembled simply by pushing the stem 26 of the silicone rubber valve member 20 into the hole in the cap 22 provided for that purpose. In that regard, the cap 22 may be injection molded to finished dimensions, including the valve seat at the periphery of the silicone rubber member 20, which can simply be a flat surface, as well as the hole for the stem 26 of the silicone rubber member and the hole or holes 28 in the cap within the periphery of the silicone rubber umbrella 20 for the unidirectional venting of the package enclosure.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. An article of manufacture for reflow soldering comprising:

a package having an exterior and an interior, the package having at least one electronic device mounted within the interior of the package electrically connected to a lead-free solder ball grid array on a surface of the package, the package having a check valve between the interior and exterior of the package configured to allow gases to flow from the interior to the exterior and to prevent moisture and contaminant flow from the exterior to the interior, the check valve including a silicone rubber umbrella check valve member having a stem and an umbrella-like top, the top being elastically encouraged to the check valve closed condition.

2. The article of claim 1 wherein the package comprises a base and an injection molded cover joined to the base, the base having the lead-free solder ball grid array on one surface thereof on the exterior of the package and the at least one electronic device mounted thereon in the interior of the package, the cover having a first hole receiving the stem of the umbrella check valve member, and a sealing surface on the exterior of the package engaging and elastically deflecting the umbrella-like top, the cover having at least one additional hole through the cover within the periphery of the top of the umbrella check valve member to allow gases to flow from the interior to the exterior.

3. The article of claim 2 wherein the base is a circuit board.

4. The article of claim 2 wherein the holes in the cover are molded in.

5. The article of claim 1 wherein the at least one electronic device comprises an SRAM with a rechargeable battery for nonvolatile battery backup of the SRAM.

6. An article of manufacture for reflow soldering comprising:

a package having an exterior and an interior, the package having at least one electronic device mounted within the interior of the package electrically connected to a lead-free solder ball Grid array on a surface of the package, the package having a check valve between the interior and exterior of the package configured to allow gas flow from the interior to the exterior and to prevent moisture and contaminant flow from the exterior to the interior, the check valve including a silicone rubber umbrella check valve member having a stem and an umbrella-like top, the top being elastically encouraged to the check valve closed condition, wherein the umbrella-like top is recessed with respect to an adjacent exterior surface of the package.

* * * * *